United States Patent [19]

Ching et al.

[11] Patent Number: 4,633,582
[45] Date of Patent: Jan. 6, 1987

[54] METHOD FOR ASSEMBLING AN OPTOISOLATOR AND LEADFRAME THEREFOR

[75] Inventors: Steve Ching, San Jose; Frank Babbitt, Jr., Palo Alto; Adnan Merchant, San Jose, all of Calif.; Putt C. Yong, Kajang, Malaysia

[73] Assignee: General Instrument Corporation, New York, N.Y.

[21] Appl. No.: 765,582

[22] Filed: Aug. 14, 1985

[51] Int. Cl.$^4$ ............... H01R 43/00; H01L 23/50
[52] U.S. Cl. ................................. 29/827; 357/70; 357/19; 174/52 FP; 250/551
[58] Field of Search ............ 29/827, 577; 174/52 FP; 357/68, 70, 19; 250/551

[56] References Cited

U.S. PATENT DOCUMENTS

| | | | |
|---|---|---|---|
| 3,494,022 | 2/1970 | Maute | 29/577 |
| 3,660,669 | 5/1972 | Grenon | 250/217 |
| 3,808,673 | 5/1974 | Bottini | 29/577 |
| 3,893,158 | 7/1975 | Lincoln | 357/70 |
| 4,047,045 | 9/1977 | Paxton, Jr. et al. | 250/551 |
| 4,156,148 | 5/1979 | Kaufman | 250/551 |
| 4,160,308 | 7/1979 | Courtney et al. | 29/588 |
| 4,266,140 | 5/1981 | Kaufman | 250/551 |
| 4,322,628 | 3/1982 | Tanaka | 357/19 X |
| 4,446,375 | 5/1984 | Aird | 357/19 X |
| 4,450,461 | 5/1984 | Cook et al. | 357/19 |
| 4,478,588 | 10/1984 | Lockard | 445/22 |

FOREIGN PATENT DOCUMENTS 54-12688  1/1979  Japan ............................. 357/19
60-16111  4/1985  Japan.

Primary Examiner—Howard N. Goldberg
Assistant Examiner—Carl J. Arbes
Attorney, Agent, or Firm—Barry R. Lipsitz

[57] ABSTRACT

An optoisolator leadframe includes first and second spaced parallel rails. First and second tie bars extend perpendicularly from the rails and connect the rails to form a planar open frame. A first lead assembly has a pad extending therefrom and is mounted to the open frame in coplanar relation therewith. A second lead assembly has a pad extending therefrom and is rotatably mounted to the open frame to enable the second lead assembly to be rotated 180° from an initial position coplanar with the open frame to a second position coplanar with the open frame. In the second position, the pad of the second lead assembly is in overlying alignment with the pad of the first lead assembly. A tab and notch arrangement is provided to limit the travel of the second lead assembly as it is rotated to the second position. The tab and notch arrangement ensures that a coplanar relationship between the first and second lead assemblies is achieved and secures the second lead assembly in the second position. A method for assembling an optoisolator using the leadframe is also disclosed.

17 Claims, 8 Drawing Figures

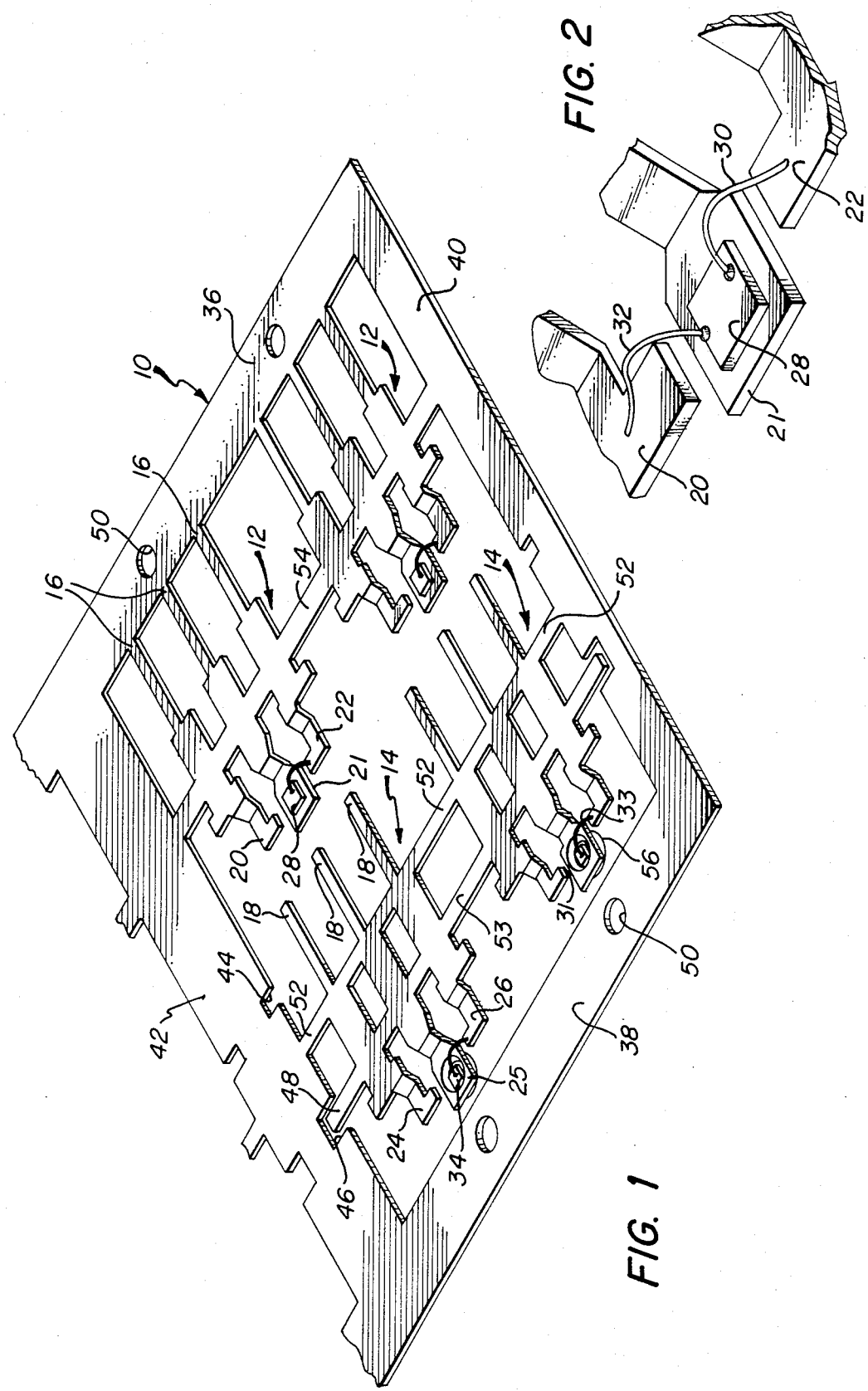

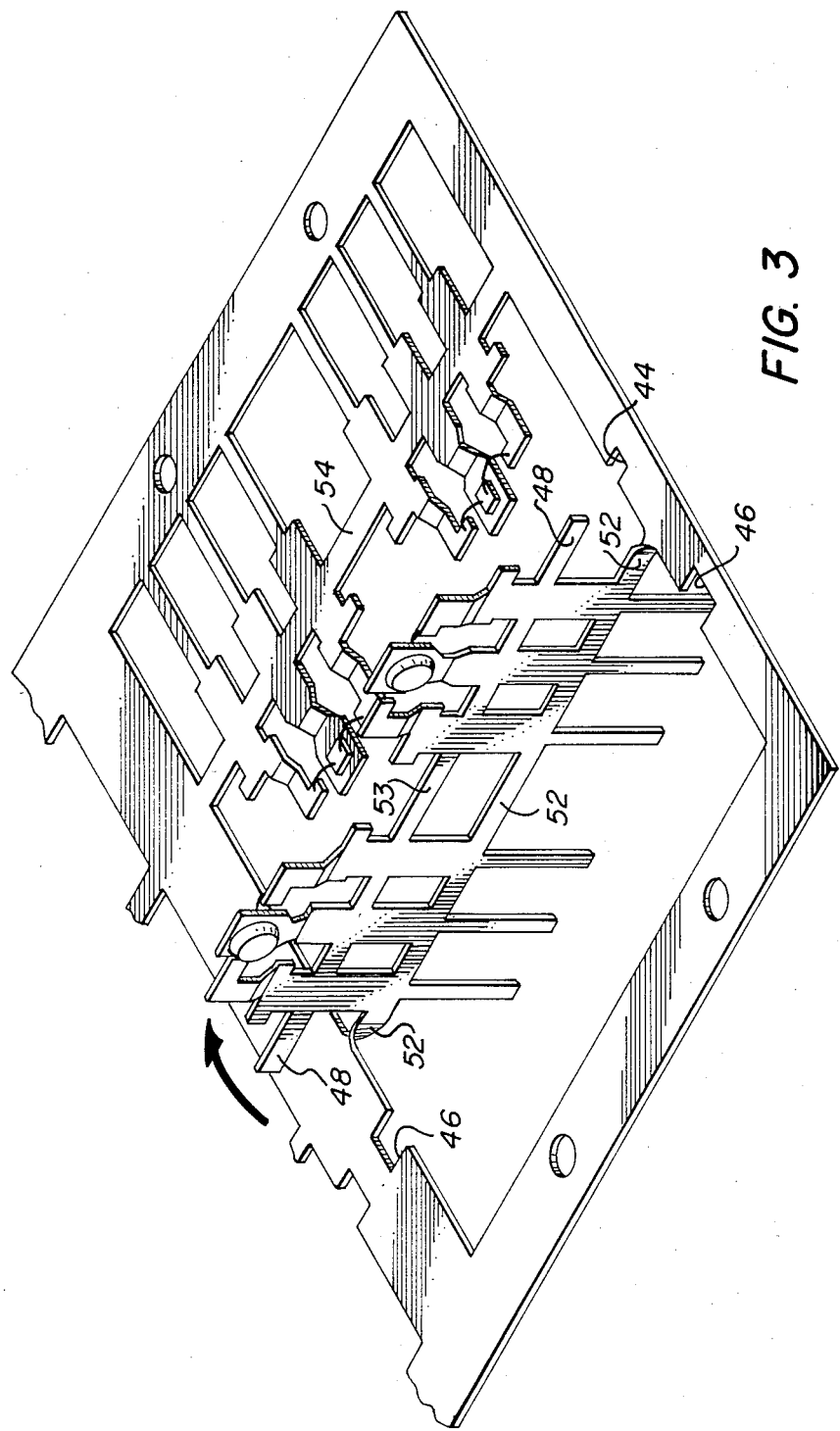

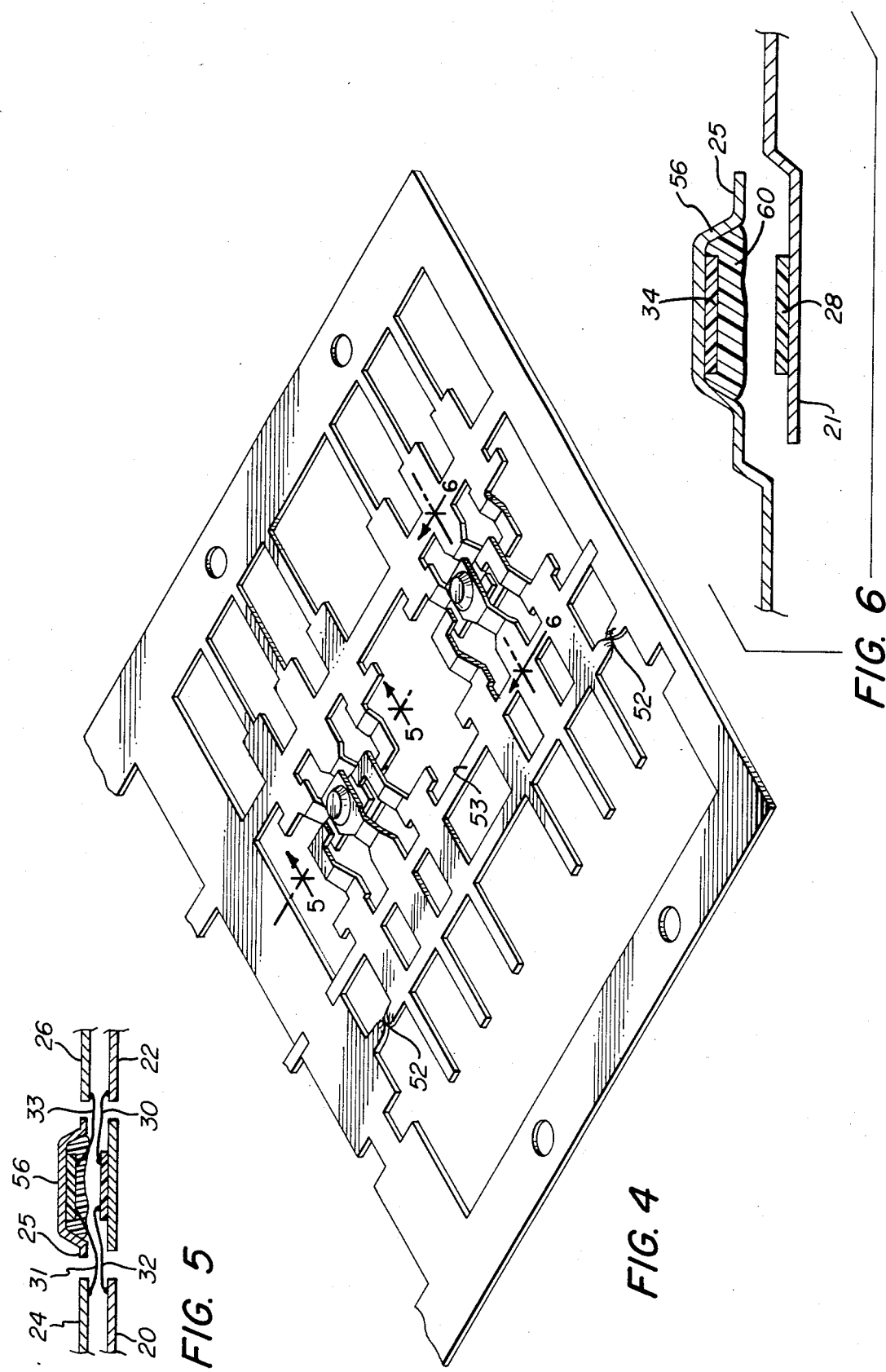

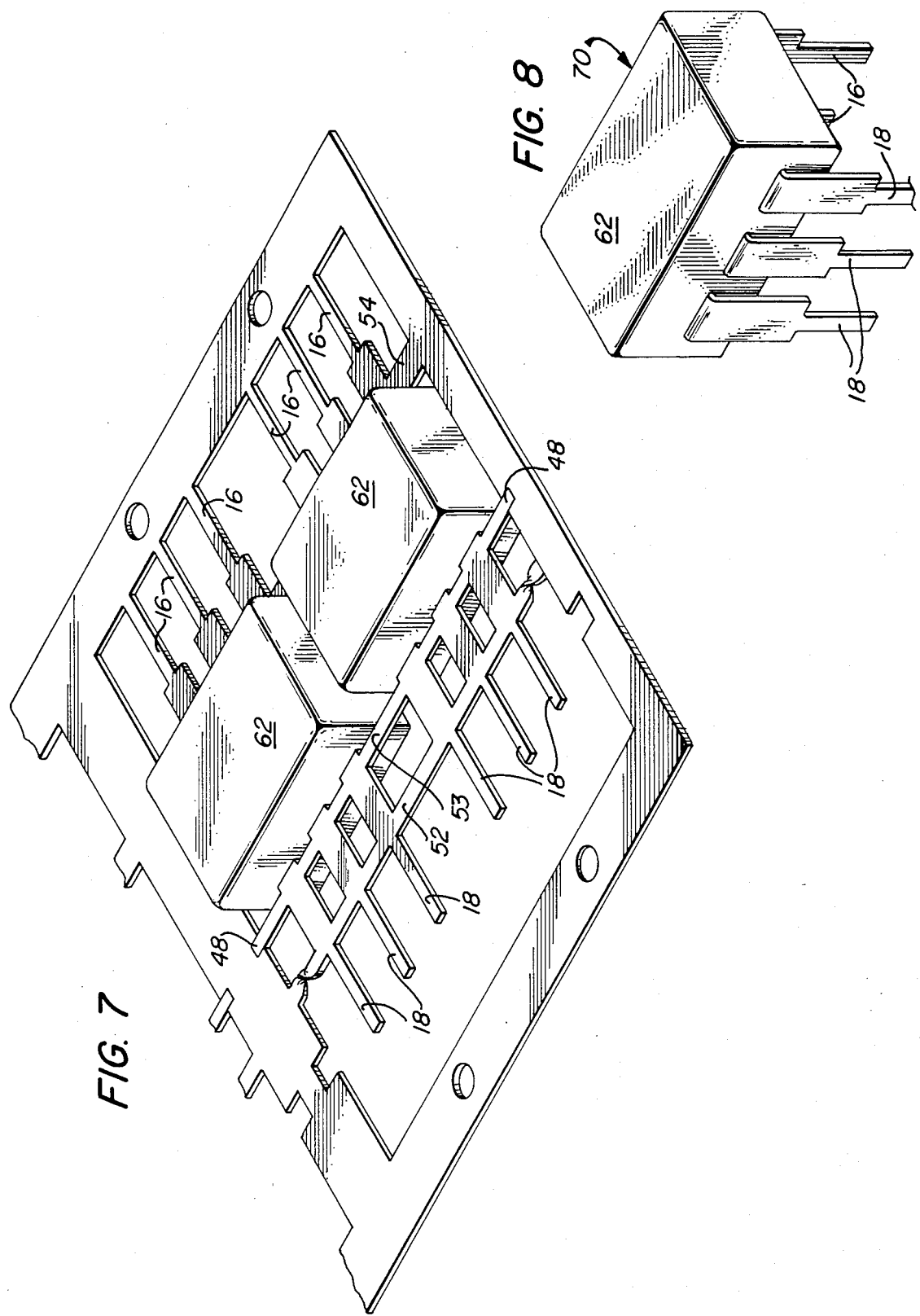

METHOD FOR ASSEMBLING AN OPTOISOLATOR AND LEADFRAME THEREFOR

BACKGROUND OF THE INVENTION

The present invention relates to optoisolators and more particularly, to an optoisolator leadframe and method of manufacturing optoisolators using the leadframe.

Optoisolators are electronic components which transmit electrical information between a light source (emitter) and a light detector (receiver), without electrical connection. The light emitted can be either invisible (e.g., infrared) or can be light in the visible spectrum. An input signal to the optoisolator causes the light source to turn on. When this happens, the light detector senses the light from the source and produces an output signal proportional thereto. In this manner, the output signal follows the input signal without the need for any direct electrical connection between the input and output of the device. The input is coupled to the output optically rather than electrically; hence, the name optoisolator.

In order for an optoisolator to operate properly, the light source and light detector must be oriented properly with respect to each other. If too little light reaches the detector, then device sensitivity suffers. If too much light reaches the detector, then device speed suffers because saturation of the phototransistor on the detector reduces its switching speed. It is also important to carefully regulate the spacing between the emitter and detector. If the spacing is too great, light transfer efficiency will be decreased. If the emitter and detector are too close to one another, the isolation voltage between the input and output of the optoisolator decreases.

In the prior art, optoisolators have been manufactured by gluing a carrier containing a separate light source or plurality of light sources together with a carrier containing a light detector or plurality of detectors. After the carrier containing the light sources and detectors are permanently secured to one another, the optocoupler is tested to determine whether it meets the electrical specifications for which it was designed. In manufacturing such optoisolators, there is no precise control over the final orientation of the light source and light detector with respect to one another.

In other prior art structures, emitter and detector dies are placed side by side and a reflective dome is placed over the assembly to reflect light from the emitter to the detector. In still other known structures, overlapping strips are utilized to register an emitter over a detector. Such structures require complex molds in order to accommodate the alternating raised and recessed levels of the stacked non-coplanar strips. Additionally, tolerance variations (e.g., in the thickness of each strip) can lead to inconsistent alignment of the emitter and detector.

In manufacturing optoisolators, it is conventional to use an element known as a leadframe to form the leads through which electrical connections to the finished optoisolator can be made. A leadframe comprises a plurality of individual lead members that are tied together in a metal frame. All of the leads are electrically shorted together when they are in the leadframe. Free ends of the lead members are connected through delicate wires to proper points on the emitter and detector dies. The lead members are severed from the rest of the leadframe, and hence from one another, during a final step in the optoisolator packaging process. Once the package has been assembled and severed from the leadframe, it is too late to make any adjustment to the orientation between the light source and light detector.

It would be advantageous to provide a leadframe and a method for assembling an optoisolator that ensure proper alignment between the emitter and detector dies. It would be further advantageous if the leadframe consisted of a single strip to which both the emitter and detector dies are attached. In such an arrangement, wire bonding would advantageously occur on the same side of the same strip for both the emitter and detector dies. In order to provide proper orientation and alignment between the emitter and detector, it would be advantageous to provide a coplanar arrangement between the emitter and detector lead assemblies of the leadframe. To facilitate the manufacture of a completed optoisolator, the coplanar relationship should be maintained during initial processing when the emitter and detector dies are attached to the leadframe, and during subsequent processing when the emitter and detector dies are placed into proper orientation with respect to one another. It would also be preferable to provide means for securing the emitter and detector lead assemblies in proper alignment within the leadframe prior to encapsulation of the device into a final product.

The present invention provides a leadframe and method for assembling the leadframe into an optoisolator enjoying the advantages noted above.

SUMMARY OF THE INVENTION

In accordance with the present invention, a leadframe is provided for use in manufacturing an optoisolator or the like. The leadframe includes first and second spaced parallel rails with first and second tie bars extending perpendicularly from and connecting the rails to form a planar open frame. A first lead assembly has a pad extending therefrom to which a die (e.g., a detector) can be attached. Means are provided for mounting the first lead assembly to the open frame in coplanar relationship with the frame. A second lead assembly has a pad (e.g., for an emitter die) extending therefrom. Second means rotatably mounts the second lead assembly to the open frame to enable the second lead assembly to be rotated 180° from an initial position coplanar with the open frame to a second position coplanar with the open frame. In the second position, the pad of the second lead assembly is in overlying alignment with the pad of the first lead assembly. Means are provided for limiting the travel of the second lead assembly as it is rotated to the second position, thereby ensuring that a coplanar relationship between the first and second lead assemblies is achieved.

Means can further be provided for locking the second lead assembly into the second position. The travel limiting means can comprise a tab and the locking means can comprise a notch which engages the tab.

A method is provided for assembling an optoisolator or the like using a leadframe having first and second lead assemblies mounted via mounting bars to a planar frame. A first die is attached to a die pad extending from the first lead assembly. A second die is attached to a die pad extending from the second lead assembly. The second lead assembly is rotated about the axis of its associated mounting bar to place the first and second dies into overlying alignment with each other. In the process of rotating the second lead assembly, a spiral shape is twisted along the axis of the mounting bar associated with the second lead assembly. Rotation of the second lead assembly is stopped when the first lead assembly, second lead assembly, and frame are coplanar.

In accordance with the method, the first and second dies and die pads can be encapsulated to form a unitary device with leads from the first and second lead assemblies projecting therefrom. The mounting bars and frame are then sheared from the projecting leads, and the leads are bent into a desired configuration.

The leadframe used with the method can include a tab and notch arrangement for securing the second lead assembly in a proper position after rotation. The tab is forced into the notch after rotation to secure the second lead assembly in coplanar relation with the frame and first lead assembly.

BRIEF DESCRIPTION OF THE DRAWINGS

FIG. 1 is a perspective view of a leadframe in accordance with the present invention;

FIG. 2 is an enlarged detail view showing the mounting of a die to a die pad and wire bonding of the die to lead terminals;

FIG. 3 is a perspective view of a leadframe in accordance with the present invention showing one of the lead assemblies being rotated to place the emitter and detector dies in overlying relation;

FIG. 4 is a perspective view of the leadframe after one of the lead assemblies has been rotated 180° to place the emitter and detector dies in their final position;

FIG. 5 is a cross-sectional view taken along the lines 5—5 shown in FIG. 4;

FIG. 6 is a cross-sectional view taken along the lines 6—6 shown in FIG. 4;

FIG. 7 is a perspective view of the optoisolator assembly after encapsulation of the emitter and detector dies; and FIG. 8 is a perspective view of a completed optoisolator package.

DETAILED DESCRIPTION OF THE INVENTION

Turning to FIG. 1, a leadframe generally designated 10 for use in manufacturing an optoisolator or the like is shown. The leadframe includes first and second spaced parallel rails 36 and 38. First and second tie bars 40, 42 extend perpendicularly from rails 36, 38 to connect the rails and form a planar open frame.

Leadframe 10 is stamped from metal such as that known as "Alloy 42" (57.4% iron, 41% nickel) using techniques well known in the art. In a preferred embodiment, the leadframe is plated with a precious metal (e.g., silver) to improve its electrical characteristics. Holes 50 are provided on rails 36, 38 to facilitate automated handling of the leadframe as it is unwound from a roll of leadframes provided in a continuous strip.

A pair of first lead assemblies 12 are mounted to and coplanar with the open frame defined by rails 36, 38 and tie bars 40, 42. Each lead assembly 12 has a pad 21 extending therefrom onto which a die (e.g., a light detector) can be mounted.

Leadframe 10 also includes a pair of second lead assemblies 14, each having a pad 25 extending therefrom to which a die (e.g., a light emitter) can be attached. As will be apparent to those skilled in the art, although two separate first lead assemblies and two separate second lead assemblies are mounted in leadframe 10 for purposes of illustration, any reasonable number of first and second lead assemblies could alternately be provided. The present invention contemplates the use of leadframes having one, two, three, or more first and second lead assemblies in each open frame, and it is intended to cover any number of first and second lead assembly pairs in the appended claims.

The mounting of the first lead assemblies shown in FIG. 1 is accomplished through a dam bar or mounting bar 54 which extends to tie bars 40, 42. First lead assemblies 12 are also attached to first rail 36 via leads 16.

Second lead assemblies 14 are mounted to the leadframe via a mounting bar 52 which extends to tie bars 40, 42. A dam bar 53 extends across second lead assemblies 14 in parallel relation to first and second rails 36, 38, but is not attached to tie bars 40, 42. Since the ends 48 of dam bar 53 extend beyond the edges of tie bars 40, 42, notches 46 are provided in the tie bars to accommodate the ends 48. Second lead assemblies 14 include leads 18 which project toward first lead assemblies 12, and are not attached to the planar open frame. This enables the second leadframe assembly to be rotated about the axis of mounting bar 52 as will be described in greater detail below.

In fabricating an optoisolator from the leadframe of the present invention, emitter chips or "dies" are attached to pads 25 on second lead assemblies 14. Corresponding detector chips ("dies") are attached to pads 21 on first lead assemblies 12. The detectors are electrically connected to terminals 20 and 22 using, for example, conventional wire bonding techniques as shown in FIG. 2. Similarly, emitters 34 are connected to terminals 24 and 26 of the second lead assemblies via wire bonding techniques. A reflector cup 56 is provided on each of pads 25 to assist in the transmission of light from emitters 34 to detectors 28 in the completed optoisolator devices.

After the emitter and detector dies are attached to the appropriate pads on the first and second lead assemblies, the second lead assembly is rotated 180° to place emitters 34 into overlying alignment with detectors 28. Rotation of the second lead assembly from an initial position coplanar with the open frame formed by rails 36, 38 and tie bars 40, 42 to a second position coplanar with the open frame takes place about the axis of mounting bar 52. The final configuration is shown in FIG. 4. Tabs 48 (the ends of dam bar 53) serve to limit the travel of the second lead assembly as it is rotated to its final position, and thereby ensure that a coplanar relationship between the first and second lead assemblies is achieved. Tabs 48 are force-fit into notches 44 in tie bars 40, 42 to secure the second lead assembly in the second coplanar position.

As shown in FIGS. 3 and 4, mounting bar 52 takes on a spiral shape as the second lead assembly is rotated from its initial position to the second position. The use of such structure enables the desirable coplanar relationship between the first and second lead assemblies to be achieved. By rotating the second lead assembly about mounting bar 52, good control of the spacing between pads 21 and 25 (and thus, detectors 28 and emitters 34) is possible despite thickness variations in the sheet metal from which the leadframe is fabricated. Further, such rotation can take place when the leadframe 10 is part of a continuous strip of such leadframes. There is no need to separate each leadframe from the continuous strip coming off a spool in order to manufacture finished devices. Thus, automated assembly techniques can be used, greatly decreasing the cost of the finished product. Still further, since the open frame, first lead assembly, and second lead assembly are coplanar after rotation of the second lead assembly, the tooling required to mold a case around the emitter and detector and their respective pads is greatly simplified, as there is no need to provide a sculptured surface in the molds.

FIGS. 5 and 6 are cross-sectional views showing the alignment of detector 28 and emitter 34 after the second lead assembly 14 has been rotated into the second position. An optional light transmissive gel 60 can be placed between the emitter and detector to overcome thermal mismatch problems during subsequent molding of the device into a final package or temperature variations which occur when the optoisolator is in use. The use of such a gel is well known in the art. In accordance with the present invention, such gel can be applied to either or both of the emitter and detector dies prior to rotation of the second lead assembly.

After the second lead assembly has been rotated into its final position so that the emitter and detector are properly oriented and aligned, the emitter 34, detector 28, and their respective die pads 25, 21 are encapsulated with a conventional plastic 62 to form a unitary device with leads 16 and 18 projecting therefrom. Mounting bars 52, 54 and dam bar 53 together with rails 36, 38 and tie bars 40, 42 are sheared from the projecting leads and the leads are bent into a desired configuration. A finished optoisolator 70 is shown in FIG. 8.

It should now be appreciated that the present invention provides an optoisolator leadframe and method for assembling an optoisolator which guarantees proper alignment of the emitter and detector. The structure of the leadframe facilitates automatic attachment of the emitter and detector dies to respective die pads. Automatic wire bonding is facilitated because the emitters and detectors are facing the same direction after die attachment. After wire bonding and other desired operations (such as the application of gel) are accomplished, the lead assembly carrying one of the dies is rotated 180° to bring the dies in overlying relation. Since rotation occurs about the axis of a mounting bar, a coplanar relationship between the detector lead assembly and emitter lead assembly is maintained, ensuring proper orientation and alignment. Such coplanar arrangement obviates the need to account for various tolerance variations in the leadframe material.

While only a single embodiment has been described herein for purposes of illustration, it will be appreciated by those skilled in the art that other variations and modifications could be made thereto. It is intended to cover all of the variations and modifications which fall within the scope of the present invention, as recited in the following claims.

We claim:

1. A leadframe for use in manufacturing an optoisolator comprising:
   first and second spaced parallel rails;
   first and second tie bars extending perpendicularly from and connecting said rails to form a planar open frame;
   a first lead assembly having a pad extending therefrom;
   first means for mounting said first lead assembly to said open frame to be coplanar therewith;
   a second lead assembly having a pad extending therefrom;
   second means for rotatably mounting said second lead assembly to said open frame to enable said second lead assembly to be rotated 180° from an initial position coplanar with said open frame to a second position coplanar with said open frame, the pad of said second lead assembly in said second position being in overlying alignment with the pad of said first lead assembly; and
   means operatively associated with said second lead assembly for limiting the travel of said second lead assembly as it is rotated to said second position to ensure that a coplanar relationship between the first and second lead assemblies is achieved.

2. The leadframe of claim 1 further comprising means operatively associated with said second lead assembly for securing the second lead assembly into said second position.

3. The leadframe of claim 2 wherein the travel limiting means comprises a tab and the securing means comprises a notch which engages the tab.

4. The leadframe of claim 1 wherein said second means comprises a mounting bar parallel to said rails which extends from the second lead assembly to said tie bars, whereby the rotation of the second lead assembly occurs about the axis of the mounting bar causing the mounting bar to take on a spiral shape.

5. The leadframe of claim 4 wherein the travel limiting means comprises a tab extending from said second lead assembly that securely engages a corresponding notch in said open frame when the second lead assembly is in the second position.

6. The leadframe of claim 5 further comprising a notch in said open frame to accommodate said tab when the second lead assembly is in the first position.

7. A method for assembling an optoisolator comprising the steps of:
   providing a leadframe having first and second lead assemblies mounted via mounting bars to a planar frame;
   attaching a first die to a die pad extending from the first lead assembly;
   attaching a second die to a die pad extending from the second lead assembly;
   rotating said second lead assembly about the axis of its associated mounting bar to place said first and second dies into overlying alignment with each other, thereby twisting a spiral shape along the axis of said bar; and
   stopping said rotation when said first lead assembly, second lead assembly, and frame are coplanar.

8. The method of claim 7 comprising the further steps of:
   encapsulating the first and second dies and die pads to form a unitary device with leads from the first and second lead assemblies projecting therefrom;
   shearing the mounting bars and frame from the projecting leads; and
   bending the projecting leads into a desired configuration.

9. The method of claim 7 comprising the further step of:
   connecting wires from the first die to corresponding portions of said first lead assembly and connecting wires from the second die to corresponding portions of said second lead assembly prior to said rotating step.

10. The method of claim 7 wherein said leadframe includes a tab and notch arrangement for securing said second lead assembly in a proper position after rotation, said method comprising the further step of:

forcing said tab into said notch after rotation to secure the second lead assembly in coplanar relation with the frame and first lead assembly.

11. The method of claim 10 comprising the further step of:
applying gel to at least one of said dies prior to said rotating step.

12. The method of claim 7 wherein said first die is an optical detector and said second die is an optical emitter.

13. A method for assembling an optoisolator comprising the steps of:
providing a leadframe having first and second lead assemblies mounted via mounting bars to a planar frame with a tab extending from one of said second lead assembly and said planar frame, and a notch cut into the other of said second lead assembly and said planar frame;
attaching a first die to a die pad extending from said first lead assembly;
attaching a second die to a die pad extending from said second lead assembly;
performing wire bonding operations to connect terminals on said first and second dies to corresponding leads on said first and second lead assemblies;
rotating said second lead assembly about the axis of its associated mounting bar until said tab contacts said notch, thereby placing said first and second dies into overlying alignment with each other and twisting a spiral shape along the axis of said bar; and
forcing said tab into said notch after said rotating step to secure the second lead assembly in coplanar relation with said frame and the first lead assembly.

14. The method of claim 13 comprising the further steps of:
encapsulating the first and second dies and die pads to form a unitary device with leads from the first and second lead assemblies projecting therefrom;
shearing the mounting bars and frame from the projecting leads; and
bending the projecting leads into a desired configuration.

15. The method of claim 14 comprising the further step of:
applying gel to at least one of said dies prior to said rotating step.

16. The method of claim 14 wherein said first die is an optical detector and said second die is an optical emitter.

17. The method of claim 13 wherein said rotating step comprises rotating said second lead assembly 180° about the axis of its associated mounting bar.

* * * * *